(12) United States Patent
Shinohara

(10) Patent No.: US 8,543,897 B2
(45) Date of Patent: Sep. 24, 2013

(54) TRANSMISSION APPARATUS AND PARITY CALCULATION METHOD

(75) Inventor: Akio Shinohara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 133 days.

(21) Appl. No.: 13/064,552

(22) Filed: Mar. 30, 2011

(65) Prior Publication Data

US 2011/0296284 A1 Dec. 1, 2011

(30) Foreign Application Priority Data

Jun. 1, 2010 (JP) ................... 2010-125625

(51) Int. Cl.
*G06F 11/00* (2006.01)
(52) U.S. Cl.
USPC .......................................................... 714/800
(58) Field of Classification Search
USPC .......................................................... 714/800
See application file for complete search history.

(56) References Cited

U.S. PATENT DOCUMENTS

| 5,515,362 | A | 5/1996 | Iwase | |
|---|---|---|---|---|
| 7,028,231 | B1 * | 4/2006 | Tezuka | 714/704 |
| 2006/0107192 | A1 * | 5/2006 | Mantha et al. | 714/800 |

FOREIGN PATENT DOCUMENTS

| JP | 7-17716 | 7/1995 |
|---|---|---|
| JP | 11-150526 | 6/1999 |
| JP | 11-225095 | 8/1999 |

OTHER PUBLICATIONS

Patent Abstract of Japanese Publication No. 7-177116, Published Jul. 14, 1995.
Patent Abstract of Japaneee Publication No. 11-225095, Published Aug. 17, 1999.
Patent Abstract of Japanese Publication No. 11-150528, Published Jun. 2, 1999.

* cited by examiner

*Primary Examiner* — Albert Decady
*Assistant Examiner* — Enam Ahmed
(74) *Attorney, Agent, or Firm* — Staas & Halsey LLP

(57) ABSTRACT

In a transmission apparatus, a first parity calculation controller calculates parity by the frame and inserts a calculation result into a next frame to a first frame sequence. A second parity calculation controller calculates the parity by the frame and inserts a calculation result into a next frame to a second frame sequence. The second parity calculation controller receives from the first parity calculation controller first parity data which is a parity calculation result by the first parity calculation controller and which has the same value as that of a parity calculation result to be inserted into a target frame of a parity calculation in the second frame sequence. Then, the controller calculates the parity of the target frame including the first parity data and second parity data which is a parity calculation result of a previous frame in the second frame sequence before one frame of the target frame.

9 Claims, 13 Drawing Sheets

TRANSMISSION APPARATUS AND PARITY CALCULATION METHOD

CROSS-REFERENCE TO RELATED APPLICATION

This application is based upon and claims the benefit of priority of the prior Japanese Patent Application No. 2010-125625, filed on Jun. 1, 2010 the entire contents of which are incorporated herein by reference.

FIELD

The embodiment discussed herein is related to a transmission apparatus that performs a data transmission and a parity calculation method for performing a parity calculation.

BACKGROUND

As a hierarchy multiplexing method, of digital broadcasting, an SDH (synchronous digital hierarchy)/SONET (synchronous optical network) is standardized and a development of an economical digital network progresses.

In a transmission apparatus that has an interface of the SDH/SONET, in order to confirm normality of transmission signals, parity data for detecting a code error is added and a transmission is performed.

In the SDH interface, for example, a frame having VC (virtual container)-3 signal (band: 51.84 Mbps) is configured. On this occasion, a parity of 8 bit (BIP-8: bit interleaved parity code-8) is calculated in units of frame, and its result is inserted into a particular position (B3 byte) of a next frame.

A reception-side transmission apparatus calculates the BIP-8 in units of frame, compares its result and B3 byte of a next frame, and detects a code error (in addition, in the SONET, the SDH corresponding to the VC-3 is referred to as an STS (synchronous transport signal)-1).

For example, when transmitting a frame configured in the order of frames #1 and #2, a transmission-side transmission apparatus inserts a parity calculation result of the frame #1 into the B3 byte of the frame #2 as the next frame for transmission.

When receiving the frames #1 and #2, the reception-side transmission apparatus performs a parity calculation of the frame #1, and compares the calculation result with a value inserted into the B3 byte of the frame #2, thereby detecting the code error of the frame #1.

On the other hand, a transmission system of SDH/SONET has a redundancy configuration of an active system unit and a standby system unit. Further, the transmission-side transmission apparatus is configured by both of an active system unit and a standby system unit. When the active system unit has a breakdown, or maintenance and inspection operations such as a substrate replacement of the active system unit are performed, the transmission-side transmission apparatus switches over to the standby system unit, thereby continuing a communication service.

As a conventional technique, there is proposed a technique in which when detecting a code error in a frame of a reception signal through an active transmission line, in the case where the code error is absent in a corresponding frame of a standby transmission line, a transmission apparatus switches over to the standby transmission line (see, for example, Japanese Laid-open Patent publications No. 07-177116). There is proposed a technique in which a transmission apparatus determines switching based on an error detection signal according to a delay adjustment time of a transmission line and performs transmission line switching (see, for example, Japanese Laid-open Patent publications No. 11-225095). Further, there is proposed a technique on a parity calculation circuit that designates a normal parity calculation range in a first parity calculation after recovered from out of synchronism in a synchronization transmission system (see, for example, Japanese Laid-open Patent publications No. 11-150528).

Signals flowing through a network of the SDH/SONET are transmitted in the form of a multiframe having multiplexed therein a plurality of frames. A transmission-side transmission apparatus inserts a frame head code indicating a frame head into an overhead of a transmission signal for transmission. Then, when inserting the frame head code into the overhead of the transmission signal, the transmission apparatus recalculates parity and replaces parity data as its calculation result.

However, there is the following possibility. That is, when the insertion start timing of the frame head code is different from each other between the active system unit and the standby system unit, the recalculated parity data is different from each other between the active system unit and the standby system unit. As a result, there occurs a phenomenon that the parity data is subsequently mismatched with each other between both of the units.

There is the possibility that under the above-described state, in the case where the switching operation from the active system unit to the standby system unit is performed, when performing a parity check, the reception-side transmission apparatus detects the code error. Therefore, there arises the problem that although a failure does not occur on a transmission line, the transmission apparatus incorrectly recognizes that a failure occurs and disconnects a communication line.

SUMMARY

In view of the foregoing, it is an object of the present invention to provide a transmission apparatus. According to one aspect of the present invention, this transmission apparatus includes a first parity calculation controller to calculate parity in units of frame and insert a calculation result into a next frame with respect to a first frame sequence; and a second parity calculation controller to calculate parity in units of frame and insert a calculation result into a next frame with respect to a second frame sequence, wherein the second parity calculation controller receives from the first parity calculation controller first parity data which is a calculation result in which the parity is calculated by the first parity calculation controller, and which has the same value as that of a parity calculation result to be inserted into a target frame for parity calculation in the second frame sequence, and calculates the parity of the target frame including the first parity data and second parity data which is a result in which the parity of a previous frame positioned one frame before the target frame in the second frame sequence is calculated.

The object and advantages of the invention will be realized and attained by means of the devices and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
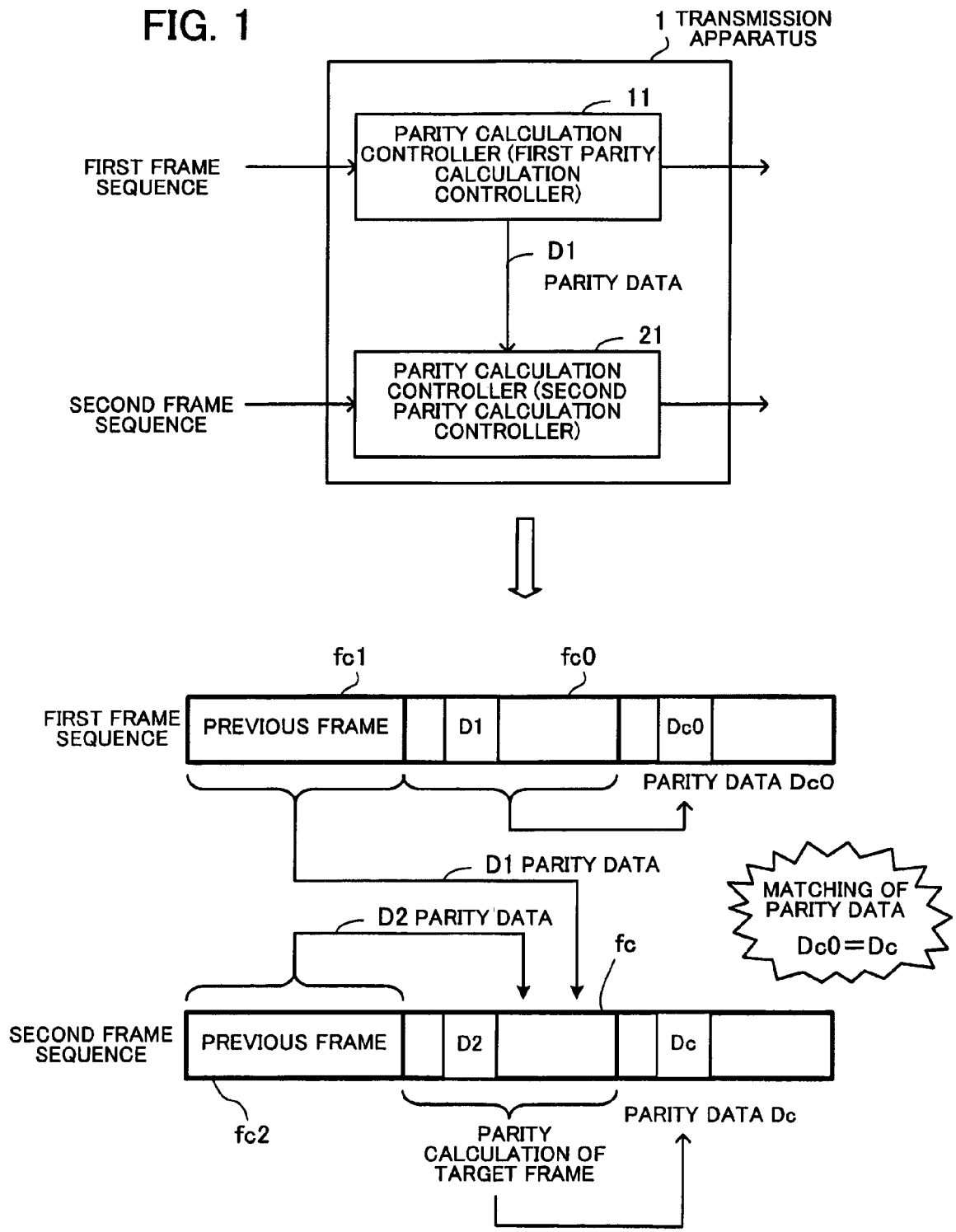
FIG. 1 illustrates a configuration example of a transmission apparatus.

Preferred embodiments of the present invention will be described below with reference to the accompanying drawings, wherein like reference numerals refer to like elements throughout. FIG. 1 illustrates a configuration example of a transmission apparatus. The transmission apparatus 1 has a redundancy configuration, and includes a parity calculation controller 11 (a first parity calculation controller) and a parity calculation controller 21 (a second parity calculation controller).

The parity calculation controller 11 performs a parity calculation to a first frame sequence in units of frame, and inserts a calculation result to a next frame. The parity calculation controller 21 performs a parity calculation to a second frame sequence in units of frame, and inserts a calculation result to a next frame.

Here, the parity calculation controller 21 receives from the parity calculation controller 11 parity data D1 (first parity data), as a calculation result in which a parity calculation is performed by the parity calculation controller 11, having the same value as that of a parity calculation result to be inserted into a target frame fc of a parity calculation in the second frame sequence.

The parity calculation controller 21 receives from the parity calculation controller 11, for example, the parity data D1 as a parity calculation result of a previous frame fc1 with respect to the previous frame fc1 in the first frame sequence positioned before one frame of the target frame fc.

Then, the parity calculation controller 21 performs a parity calculation of the target frame fc including this parity data D1 and the parity data D2 (second parity data) as a parity calculation result of a previous frame fc2 with respect to the previous frame fc2 in the second frame sequence positioned before one frame of the target frame fc.

As a result, the transmission apparatus 1 can match parity data Dc0 of a frame fc0 in the first frame sequence with parity data Dc of the frame fc in the second frame sequence. Further, when performing the same parity calculation, the transmission apparatus 1 can match one parity data in the first frame sequence with another parity data in the second frame sequence also with respect to subsequent frames.

When performing the above-described parity calculation with respect to the second frame sequence, the transmission apparatus 1 can suppress one parity data of each frame in the first frame sequence from being mismatched with another parity data of each frame in the second frame sequence.

Before details of the transmission apparatus 1 will be described below, a phenomenon that recalculated parity data of an active system unit is mismatched with that of a standby system unit will be described.

Figure 2:
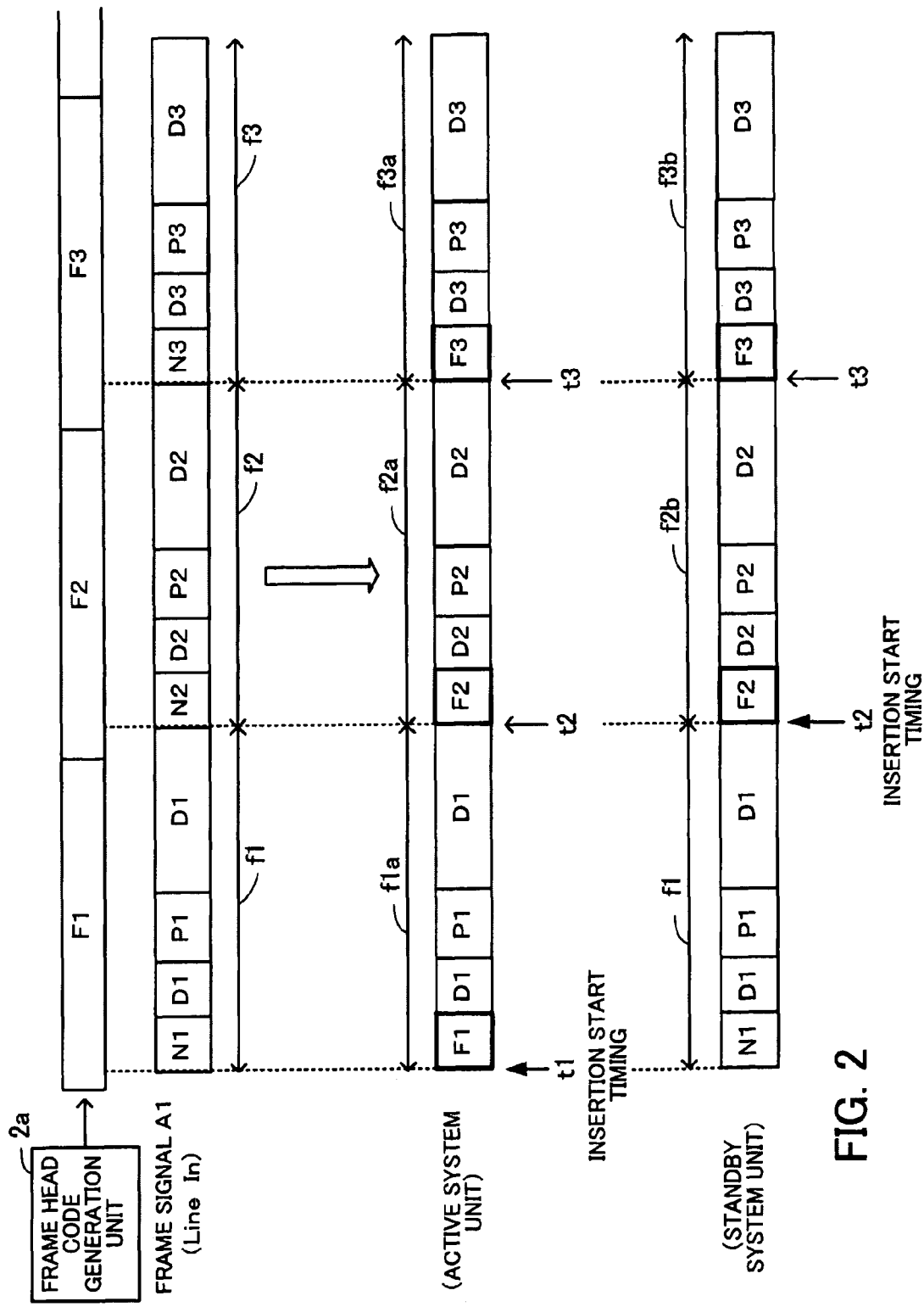
FIG. 2 illustrates a phenomenon that parity data is mismatched with each other.
Figure 3:
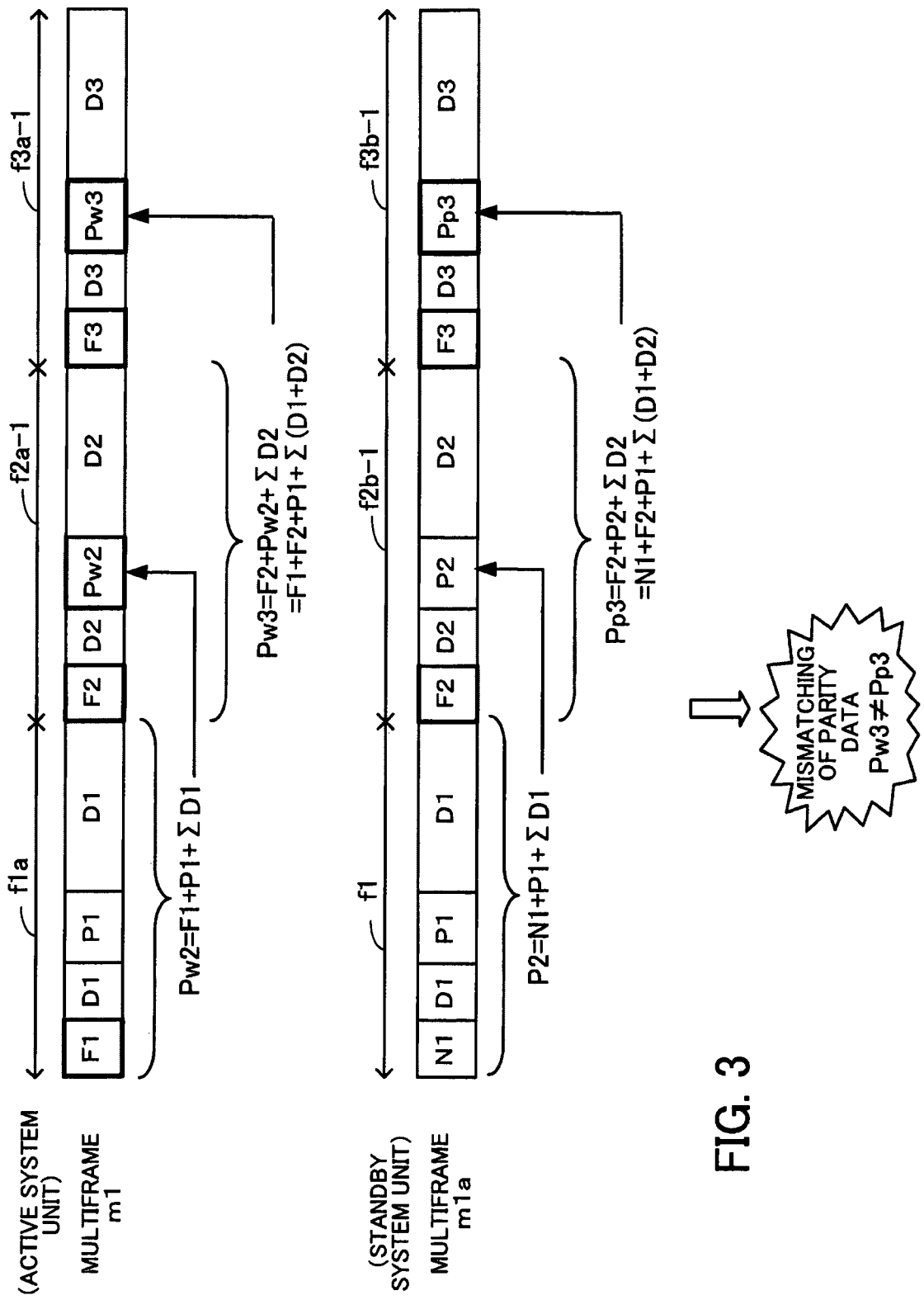
FIG. 3 illustrates a phenomenon that parity data is mismatched with each other.

FIGS. 2 and 3 illustrate the phenomenon that the parity data of the active system unit is mismatched with that of the standby system unit. FIG. 2 illustrates an appearance of insertion of a frame head code, and on the other hand, FIG. 3 illustrates an appearance of insertion of the parity data.

In FIG. 2, a frame signal A1 is a frame signal before generating a transmittable multiframe in the active system unit or a standby system unit, and is configured by frames f1 to f3.

The frame f1 includes an unused overhead N1, data D1, and parity data before replacement P1. The frame f2 includes an unused overhead N2, data D2, and parity data before replacement P2. Further, the frame f3 includes an unused overhead N3, data D3, and parity data before replacement P3.

Into the above-described unused overhead, the frame head code is inserted based on a timing signal. A frame head code generation unit 2a generates frame head codes F1 to F3.

In the insertion control of the frame head control, a plurality of frame head codes self-run in a line different from the active system unit and the standby system unit. The frame head code positioned at a time zone at which the timing signal is transmitted is selected, and then the selected frame head code is inserted into the unused overhead.

In addition, the frame head code F1 illustrated in FIGS. 2 and 3 is assumed to be a code indicating a head of the multiframe, and the frame head codes F2 and F3 are assumed to be a code indicating a head of each frame for forming the multiframe.

Next, a multiframe generation processing of the active system unit will be described with reference to FIGS. 2 and 3. On the occasion when generating a multiframe m1, the frame head code is first inserted. Suppose that in the active system unit, a timing signal t1 is matched with an insertion start timing of the frame head code.

In FIG. 2, the frame head code positioned at the timing signal t1 is the frame head code F1. Accordingly, into the unused overhead N1, the frame head code F1 is inserted and a frame f1a is formed. Subsequently, into the unused overheads N2 and N3, the relevant frame head codes are inserted based on a fixed interval, respectively.

Specifically, since positioned at a timing signal t2, the frame head code F2 is inserted into the unused overhead N2, and since positioned at a timing signal t3, the frame head code F3 is inserted into the unused overhead N3, thereby forming the frames f2a and f3a.

In the active system unit, when the above-described frame head codes F1 to F3 are inserted into the unused overheads N1 to N3, recalculation of the parity is performed. The results are inserted into a predetermined field, namely, a position of the parity data before replacement (the replacement of calculation results is performed).

The parity calculation will be described. Suppose that in FIG. 3, a data value of the frame head code F1 is "F1", a data value of the data D1 is "D1", and a data value of the parity data P1 is "P1".

A parity calculation formula of the frame f1a is the following formula (1), and parity data Pw2 as a parity calculation result of the frame f1a is calculated. Suppose that all signs "+" of the formula in the subsequent descriptions represent an exclusive OR operation.

$$Pw2=F1+P1+\Sigma D1 \tag{1}$$

The above-described parity data Pw2 is inserted into a position of the parity data before replacement P2 of the next frame f2a. Accordingly, the parity data Pw2 is inserted into a predetermined position of the frame f2a having inserted thereinto the frame head code F2, thereby generating a frame f2a-1.

In the same manner, with respect to the frame f2a-1, a data value of the frame head code F2 is "F2", a data value of the data D2 is "D2", and a data value of the parity data Pw2 is "Pw2". A parity calculation formula of the frame f2a-1 is the following formula (2), and parity data Pw3 as a parity calculation result of the frame f2a-1 is calculated.

$$Pw3=F2+Pw2+\Sigma D2=F2+(F1+P1+\Sigma D1)+\Sigma D2=F1+F2+P1+\Sigma(D1+D2) \tag{2}$$

The above-described parity data Pw3 is inserted into a position of the parity data before replacement P3 of the next frame f3a. Accordingly, the parity data Pw3 is inserted into a predetermined position of the frame f3a having inserted thereinto the frame head code F3, thereby generating the frame f3a-1.

As can be seen from the above sequence, when the frame head codes F1 to F3 and the recalculated parity data Pw2 and Pw3 are inserted into respective predetermined positions, the multiframe m1 configured by the frames f1a, f2a-1, and f3a-1 is generated in the active system unit.

Next, a multiframe generation processing in the standby system unit will be described with reference to FIGS. 2 and 3. On the occasion when generating a multiframe m1a, the frame head code is first inserted into a predetermined position. Suppose that in the standby system unit, an insertion start timing of the frame head code is a timing signal t2 different from that of the active system unit.

In FIG. 2, the frame head code positioned at the timing signal t2 is the frame head code F2. Accordingly, the frame head code F2 is inserted into the unused overhead N2, thereby generating the frame f2b.

Subsequently, the relevant frame head code is inserted into the unused overhead N3 based on a fixed interval. Specifically, since the frame head code F3 is positioned at a timing signal t3, the frame head code F3 is inserted into the unused overhead N3.

As can be seen from the above sequence, the insertion start timing of the frame head code is the timing t2 in the standby system unit. Therefore, the frame head code fails to be inserted into the unused overhead N1, and the frame head codes F2 and F3 are inserted into the unused overheads N2 and N3, respectively. When the above-described insertion control of the frame head code is finished, recalculation of the parity is performed and its results are inserted into a predetermined field, namely, the parity data before replacement.

The parity calculation will be described. Suppose that in FIG. 3, a data value of the unused overhead N1 is "N1", a data value of the data D1 is "D1", and a data value of the parity data P1 is "P1". A parity calculation formula of the frame f1 is the following formula (3), and parity data P2 as a parity calculation result of the frame f1 is calculated.

$$P2=N1+P1+\Sigma D1 \tag{3}$$

The above-described parity data P2 is inserted into a position of the parity data before replacement P2 of the next frame f2b. Accordingly, the parity data P2 is inserted into a predetermined position of the frame f2b having inserted thereinto the frame head code F2, thereby generating a frame f2b-1.

In the same manner, suppose that with respect to the frame f2b-1, a data value of the frame head code F2 is "F2", a data value of the data D2 is "D2", and a data value of the parity data P2 is "P2". A parity calculation formula of the frame f2b-1 is the following formula (4), and parity data Pp3 as a parity calculation result of the frame f2b-1 is calculated.

$$Pp3=F2+P2+\Sigma D2=F2+(N1+P1+\Sigma D1)+\Sigma D2=N1+F2+P1+\Sigma(D1+D2) \tag{4}$$

The above-described parity data Pp3 is inserted into a position of the parity data before replacement P3 of the next frame f3b. Accordingly, the parity data Pp3 is inserted into a predetermined position of the frame f3b having inserted thereinto the frame head code F3, thereby generating the frame f3b-1.

As can be seen from the above sequence, when the frame head codes F2 and F3 and the recalculated parity data P2 and Pp3 are inserted into respective predetermined positions, the multiframe m1a configured by the frames f1, f2b-1, and f3b-1 is generated in the standby system unit.

Here, the parity data Pw3 inserted into the frame f3a-1 on the active system unit side and the parity data Pp3 inserted into the frame f3b-1 on the standby system unit side are compared with each other. As can be seen from the formulas (2) and (4), the parity data Pw3 and Pp3 are mismatched with each other (the parity calculation result of the active system frame f2a-1 and that of the standby system frame f2b-1 are mismatched with each other).

Since the transmission apparatus 1 has a redundancy configuration, one multiframe generated by the active system unit need to be originally the same as the other multiframe generated by the standby system unit. Further, the parity data calculated by the active system unit and the parity data calculated by the standby system unit need to be matched with each other in respective frames at the same position.

However, as described above, when different from each other, for example, in the insertion start timing of the frame head code, the active system unit and the standby system unit are different from each other in the recalculated parity data. As a result, the parity data of both the units is subsequently mismatched with each other.

Figure 4:
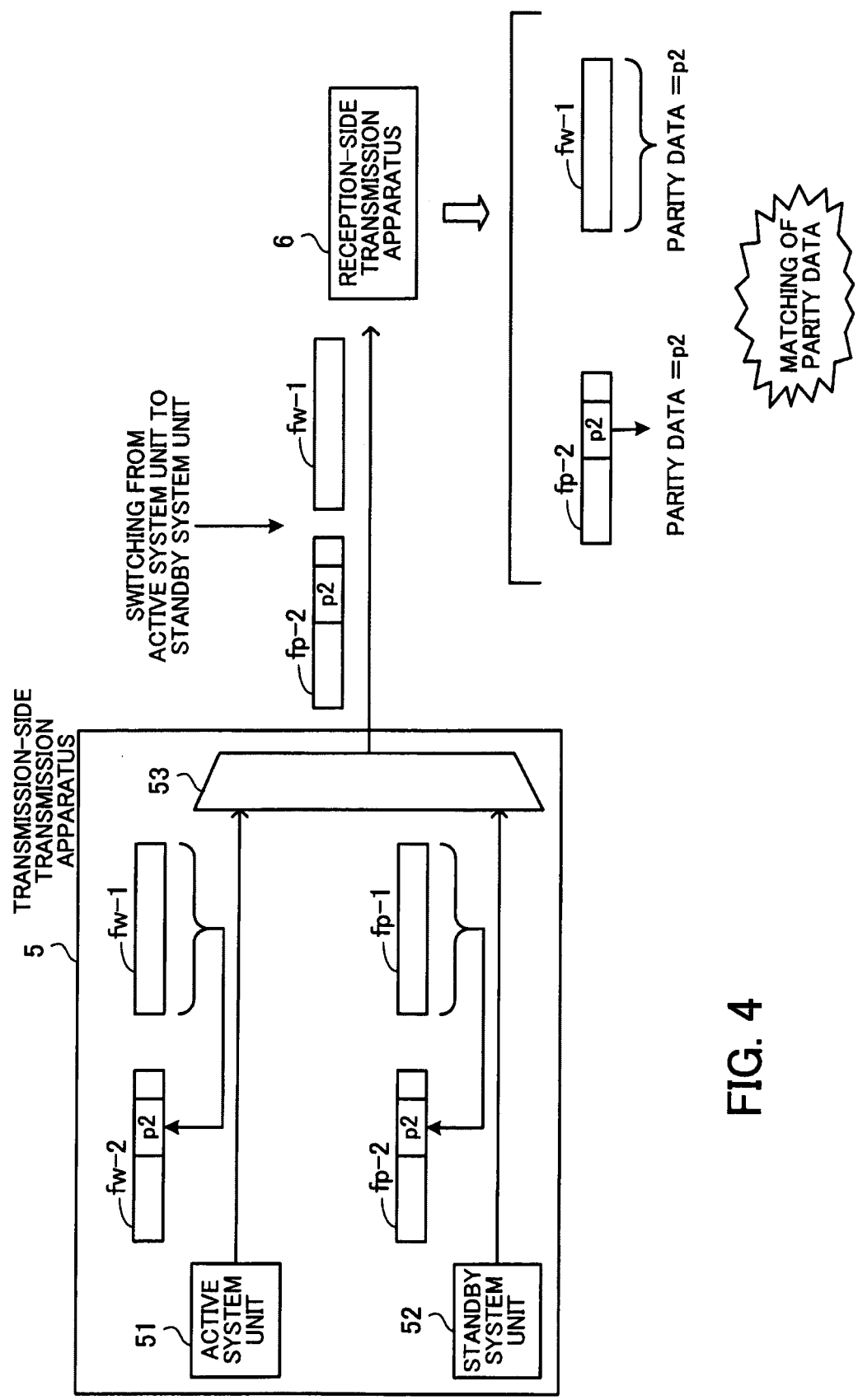
FIG. 4 illustrates a system switching operation in the case where a code error is not detected.

A code error detection operation at the reception-side transmission apparatus at the time of performing a switching operation from the active system unit to the standby system unit at the transmission-side transmission apparatus will be described below. FIG. 4 illustrates a system switching operation in the case where a code error is not detected. Specifically, FIG. 4 illustrates a state in which one parity data generated by the active system unit and the other parity data generated by the standby system unit are matched with each other, and the code error is not detected at the reception-side transmission apparatus.

The transmission-side transmission apparatus 5 has a redundancy configuration, and includes an active system unit 51, a standby system unit 52, and a selector 53. The active system unit 51 generates a frame fw-1. Further, the active system unit 51 calculates the parity of the frame fw-1, generates the parity data p2 as its calculation result, and inserts it to the next frame to thereby generate a frame fw-2.

The standby system unit 52 generates a frame fp-1 in the same manner as in the operations of the active system unit 51. Further, the standby system unit 52 calculates the parity of the frame fp-1, generates the parity data p2 as its calculation result, and inserts it to the next frame to thereby generate a frame fp-2. The frame fw-1 and the frame fp-1 are the same frame, and the frame fw-2 and the frame fp-2 are the same frame.

The selector 53 selects and outputs a frame generated by any one of the active system unit 51 and the standby system unit 52. Suppose that in this case, the selector 53 selects and outputs the frame fw-1 generated by the active system unit 51, and performs a switching operation from the active system unit to the standby system unit after the output of the frame fw-1. Accordingly, the selector 53 outputs the frame fp-2 generated by the standby system unit 52 after the output of the frame fw-1.

Suppose here that a transmission line is not faulty between the transmission-side transmission apparatus and the reception-side transmission apparatus. The reception-side transmission apparatus 6 calculates the parity of the received frame fw-1, and acquires the parity data p2 as calculation results. Since the parity data of the frame fw-1 calculated by the transmission-side transmission apparatus 5 is inserted into the next frame, the reception-side transmission apparatus 6 determines whether the parity data inserted into the next frame and that acquired by calculating the parity of the frame fw-1 are matched with each other.

That is, the reception-side transmission apparatus 6 determines whether the parity data inserted into the next frame fp-2 and that acquired by calculating the parity of the frame fw-1 are matched with each other. In the case of this example, since the parity data p2 is inserted into the received frame fp-2, both sets of the parity data are matched with each other, and therefore, the reception-side transmission apparatus 6 determines that the code error is absent.

As can be seen from the above sequence, the transmission frames output from the active system unit and the standby system unit are completely matched with each other, and the switching operation is performed from the active system unit to the standby system unit. In the above-described case, when the transmission line is not faulty, the reception-side transmission apparatus detects no code errors.

Figure 5:
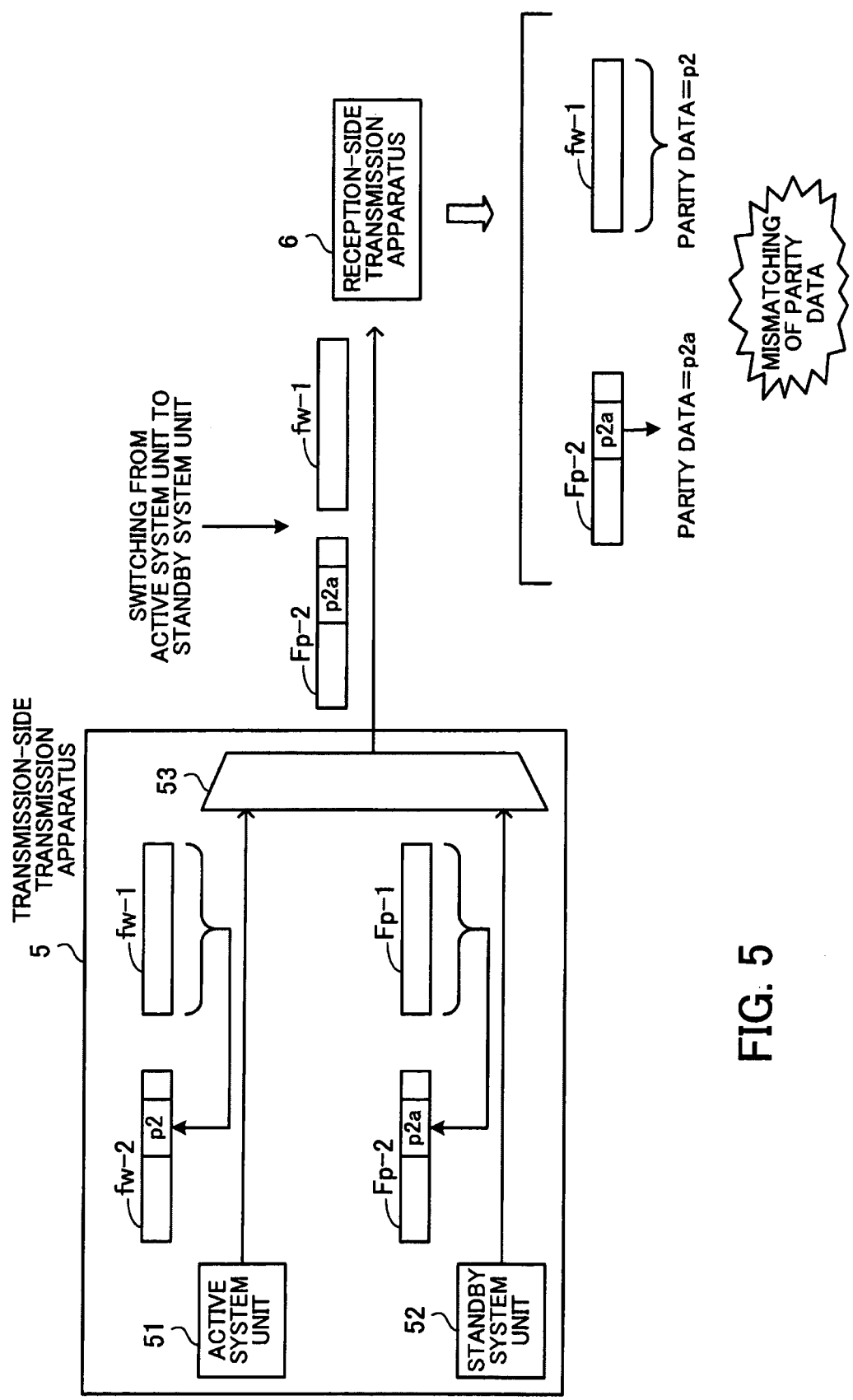
FIG. 5 illustrates a system switching operation in the case where a code error is detected.

FIG. 5 illustrates a system switching operation in the case of detecting the code error. Specifically, FIG. 5 illustrates a state in which the parity data generated by the active system unit 51 and the parity data generated by the standby system unit 52 are mismatched with each other and the code error is detected.

The active system unit 51 generates the frame fw-1 including the parity data p1. Further, the active system unit 51 calculates the parity of the frame fw-1 and inserts the parity data p2 as its calculation result into the next frame to thereby generate the frame fw-2.

Suppose, for example, that the standby system unit 52 generates a frame Fp-1 different from the frame fw-1 in a part of field data due to a difference of the insertion start timing of the frame head codes in the active system unit and the standby system unit. Further, the standby system unit 52 calculates the parity of the frame Fp-1 and inserts parity data p2a as its calculation result into the next frame to thereby generate a frame Fp-2.

Suppose that the selector 53 selects and outputs the frame fw-1 generated by the active system unit 51, and performs a switching operation from the active system unit to the standby system unit after the output of the frame fw-1. Accordingly, the selector 53 outputs the frame Fp-2 generated by the standby system unit 52 after the output of the frame fw-1.

Here, the reception-side transmission apparatus 6 calculates the parity of the received frame fw-1 and acquires the parity data p2 as calculation results. Since the parity data of the frame fw-1 calculated by the transmission-side transmission apparatus 5 is inserted into the next frame, the reception-side transmission apparatus 6 determines whether the parity data inserted into the next frame Fp-2 and the parity data acquired by calculating the parity of the frame fw-1 are matched with each other.

In the case of this example, since the parity data p2a is inserted into the received frame Fp-2 and is mismatched with the parity data p2 of the frame fw-1 (p2≠p2a), the reception-side transmission apparatus 6 detects the code error. In this case, there is the possibility that even if the transmission line is not faulty between the transmission-side transmission apparatus and the reception-side transmission apparatus, a communication failure is considered to occur and a communication is disconnected.

To solve the above-described problem, there is considered a process that a result in which the parity of the active system frame is calculated is simply inserted into a corresponding standby system frame.

Figure 6:
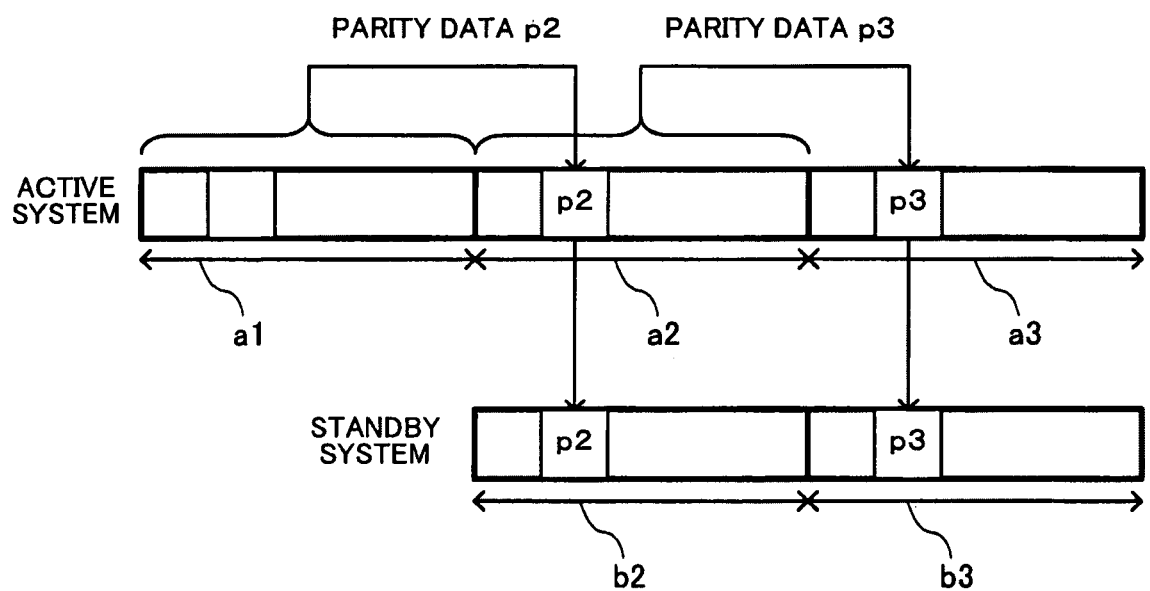
FIG. 6 illustrates an appearance in which the parity data calculated by an active system unit is inserted into a corresponding frame of a standby system unit.

FIG. 6 illustrates an appearance in which the parity data calculated by the active system unit is inserted into a corresponding frame in the standby system unit. Standby system frames b2 and b3 correspond to active system frames a2 and a3.

The active system unit inserts the parity data p2 as a parity calculation result of the frame a1 into a predetermined position of the frame a2. At this time, the active system unit inserts the parity data p2 also into a predetermined position of the frame b2. In the same manner, the active system unit inserts the parity data p3 as a parity calculation result of the frame a2 into a predetermined position of the frame a3. At this time, the active system unit inserts the parity data p3 also into a predetermined position of the frame b3.

When performing the above-described control, the transmission apparatus 1 can match the parity data of the active system unit with that of the standby system unit. However, there is the possibility that on the occasion when inserting the parity data calculated by the active system unit into a predetermined position of the standby system frame, timing of the active system unit is too late for that of the standby system unit. Accordingly, there is the possibility that a frame into which the parity data fails to be inserted is generated in the standby system unit.

For example, when the parity data p2 of the frame a1 calculated by the active system unit is inserted into the frame b2, a parity data insertion position of the frame b2 is not necessarily timely located at a suitable position. Accordingly, even if the transmission apparatus 1 performs control to simply insert the parity data calculated by the active system unit into a corresponding position of the standby system frame, the insertion is hard to be timely performed in some cases. The above-described control illustrated in FIG. 6 is not considered to be preferable countermeasures.

In view of the foregoing, in the present invention, when matching the parity data of the active system unit with that of the standby system unit and performs a system switching operation, the transmission apparatus 1 improves transmission quality and reliability of the redundancy configuration.

Figure 7:
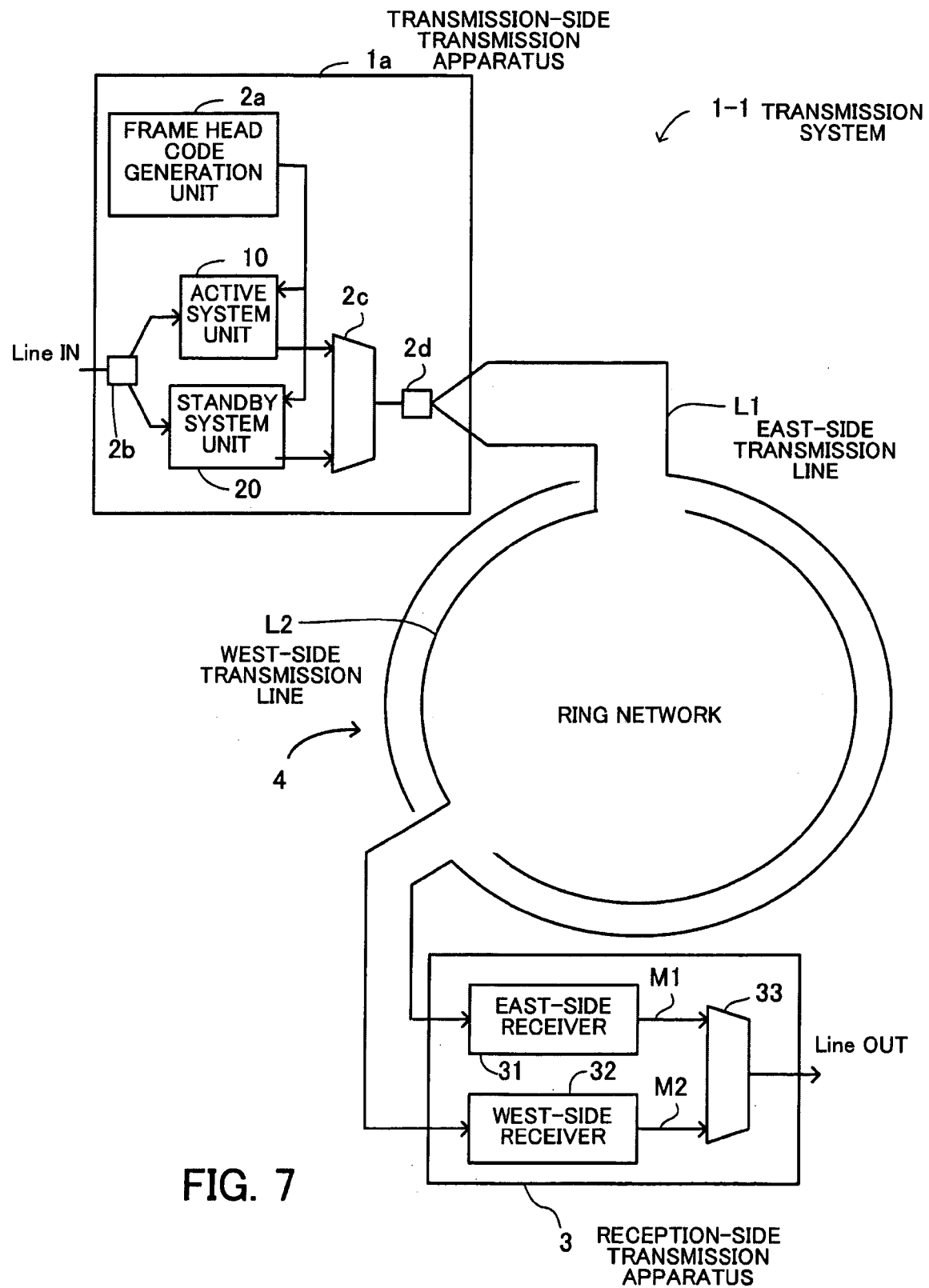
FIG. 7 illustrates a transmission system.

A transmission system having a ring network will be described below as an application example of the transmission apparatus 1. FIG. 7 illustrates the transmission system. The transmission system 1-1 includes a transmission-side transmission apparatus 1a, reception-side transmission apparatus 3, and a ring network 4. The transmission-side transmission apparatus 1a includes a function of the transmission apparatus 1. Further, the transmission-side transmission apparatus 1a is connected to the reception-side transmission apparatus 3 via the ring network 4.

The transmission-side transmission apparatus 1a includes an active system unit 10, a standby system unit 20, a frame head code generation unit 2a, branch units 2b and 2d, and a selector 2c. The reception-side transmission apparatus 3 includes an east-side receiver 31, a west-side receiver 32, and a selector 33.

In the transmission-side transmission apparatus 1a, the frame head code generation unit 2a generates a frame head code. The branch unit 2b branches an input frame signal into two, and transmits the one signal to the active system unit 10 and the other signal to the standby system unit 20.

The active system unit 10 inserts the frame head code into a predetermined position of the input frame signal based on the insertion start timing of its own unit. Further, the active system unit 10 calculates the parity in units of frame, and inserts calculation results into the next frame to thereby generate a multiframe.

The standby system unit 20 inserts the frame head code into a predetermined position of the input frame signal based on the insertion start timing of its own unit. Further, the standby system unit 20 calculates the parity in units of frame, and inserts parity calculation results into the next frame to thereby generate a multiframe.

The selector 2c selects and outputs any one of one multiframe transmitted from the active system unit 10 and the other multiframe transmitted from the standby system unit 20. The branch unit 2d branches the multiframe output from the selector 2c into two, and outputs the one from the east-side transmission line L1 and the other from the west-side transmission line L2 (the multiframe output from the east-side transmission line L1 is referred to as an east-side multiframe, and the multiframe output from the west-side transmission line L2 is referred to as a west-side multiframe).

In the reception-side transmission apparatus 3, the east-side receiver 31 performs reception processing of the east-side multiframe, and outputs a multiframe M1 after the reception processing. The west-side receiver 32 performs reception processing of the west-side multiframe, and outputs a multiframe M2 after the reception processing. The selector 33 selects and outputs any one of the multiframe M1 transmitted from the east-side receiver 31 and the multiframe M2 transmitted from the west-side receiver 32.

Figure 8:
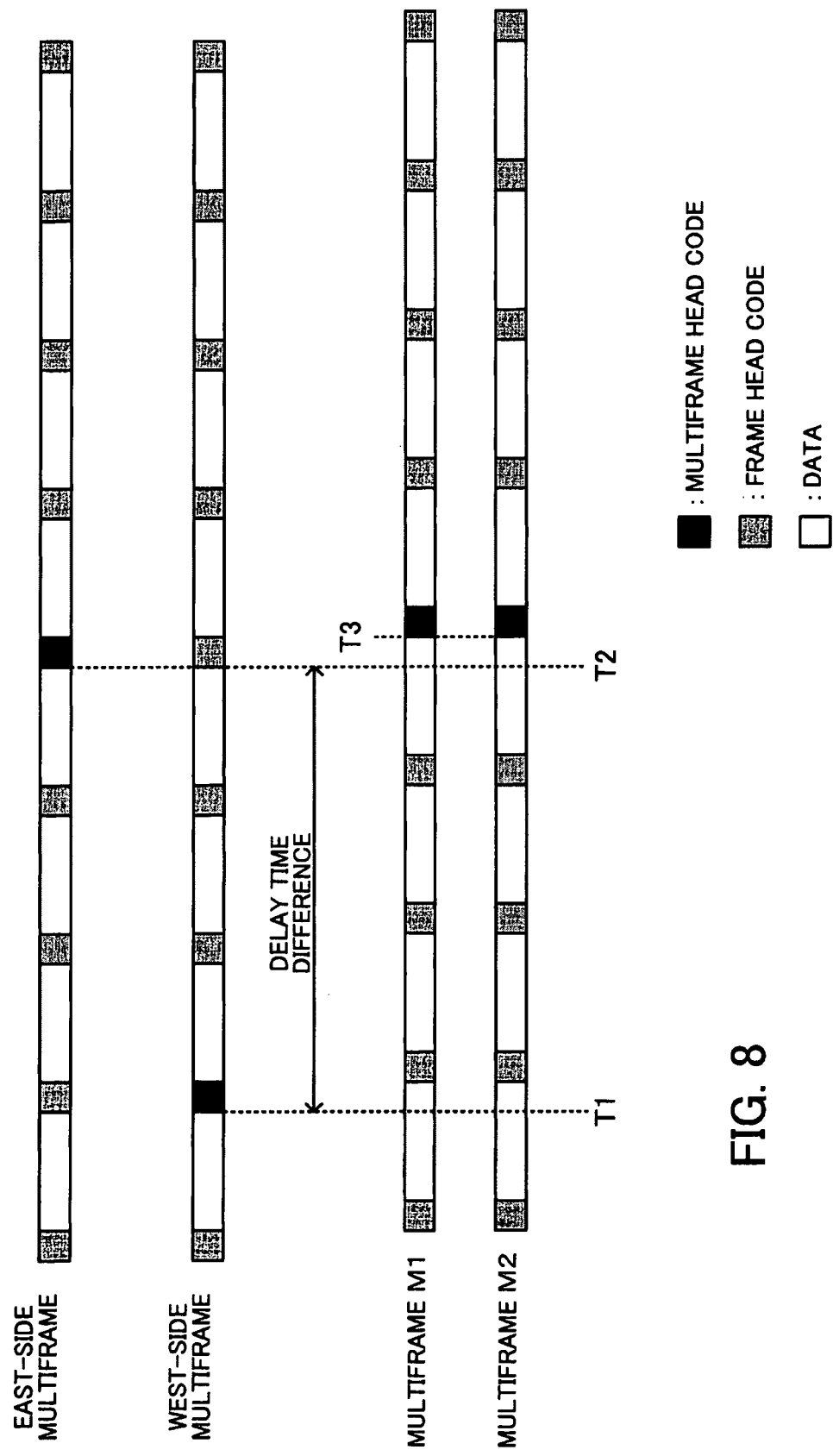
FIG. 8 illustrates an operation of a head position adjustment of multiframes.

FIG. 8 illustrates operations of a head position adjustment of the multiframes M1 and M2. The one east-side multiframe transmitted by the transmission-side transmission apparatus 1a reaches the reception-side transmission apparatus 3 via the east-side transmission line L1. Further, the other west-side multiframe transmitted by the transmission-side transmission apparatus 1a reaches the reception-side transmission apparatus 3 via the west-side transmission line L2.

Accordingly, an arrival time difference occurs between the arrival time of the east-side multiframe and that of the west-side multiframe. Therefore, the east-side receiver 31 and the west-side receiver 32 perform delay adjustment, and perform the head position adjustment of both the multiframes M1 and M2.

In FIG. 8, a delay time difference of three frames is present between the west-side multiframe and the east-side multiframe. When recognizing a multiframe head code of the west-side multiframe, the west-side receiver 32 writes the west-side multiframe at the time T1 and reads out it at the time T3 with respect to an internal buffer.

On the other hand, when recognizing a multiframe head code of the east-side multiframe, the east-side receiver 31 writes the east-side multiframe at the time T2 and reads out it at the time T3 with respect to an internal buffer.

When performing the above-described write/read control with respect to the internal buffer, the reception-side transmission apparatus 3 can match a position of the multiframe head code of the east-side multiframe with that of the west-side multiframe to thereby perform the delay adjustment. As a result, the selector 33 receives two multiframes M1 and M2 with no delay time difference. Therefore, even if a line disturbance occurs on any one of the east-side transmission line L1 and the west-side transmission line L2, when performing an east/west switching operation over a side in which a failure does not occur, the transmission-side transmission apparatus can continue a communication service without any instantaneous disconnection.

Figure 9:
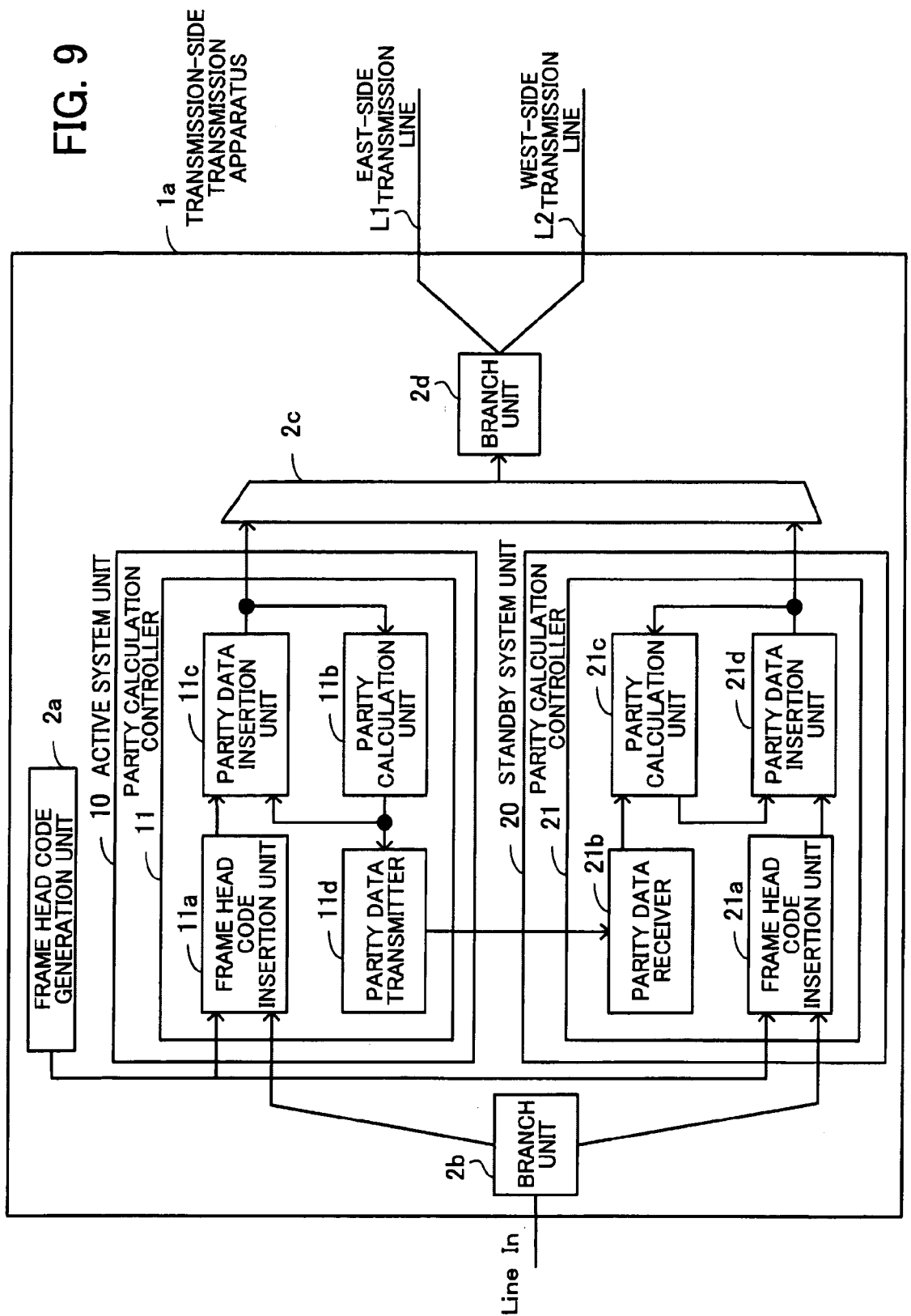
FIG. 9 illustrates a configuration example of a transmission-side transmission apparatus.

A configuration of the transmission-side transmission apparatus 1a will be described below. FIG. 9 illustrates a configuration example of the transmission-side transmission apparatus 1a. The transmission-side transmission apparatus 1a includes the active system unit 10, the standby system unit 20, the frame head code generation unit 2a, the branch units 2b and 2d, and the selector 2c. Since every component except the active system unit 10 and the standby system unit 20 is described with reference to FIG. 7, configurations of the active system unit 10 and the standby system unit 20 will be described.

The active system unit 10 has a parity calculation controller 11, and the parity calculation controller 11 includes a frame head code insertion unit 11a, a parity calculation unit 11b, a parity data insertion unit 11c, and a parity data transmitter 11d.

The standby system unit 20 includes a parity calculation controller 21, and the parity calculation controller 21 includes a frame head code insertion unit 21a, a parity data receiver 21b, a parity calculation unit 21c, and a parity data insertion unit 21d.

In the active system unit 10, the frame head code insertion unit 11a inserts the frame head code generated by the frame head code generation unit 2a into a predetermined position of the one frame signal branched by the branch unit 2b based on the insertion start timing of its own unit.

The parity calculation unit 11b calculates the parity of a frame having inserted thereinto the frame head code, and generates the parity data as its calculation result. The parity data insertion unit 11c inserts the parity data into a predetermined position of the frame. The parity data transmitter 11d transmits the parity data to the standby system unit 20.

In the standby system unit 20, the frame head code insertion unit 21a inserts the frame head code generated by the frame head code generation unit 2a into a predetermined position of the other frame signal branched by the branch unit 2b based on the insertion start timing of its own unit. The parity data receiver 21b receives the parity data transmitted from the active system unit 10.

The parity calculation unit 21c calculates the parity of the target frame including the parity data, which is transmitted from the active system unit 10 with respect to the target frame of the parity calculation, of the same value as that of its parity calculation result to be inserted into the target frame and the parity data as its parity calculation result in which the parity calculation is performed before one frame of the target frame. The parity data insertion unit 21d inserts the parity data after the calculation into a predetermined position of the next frame.

Figure 10:
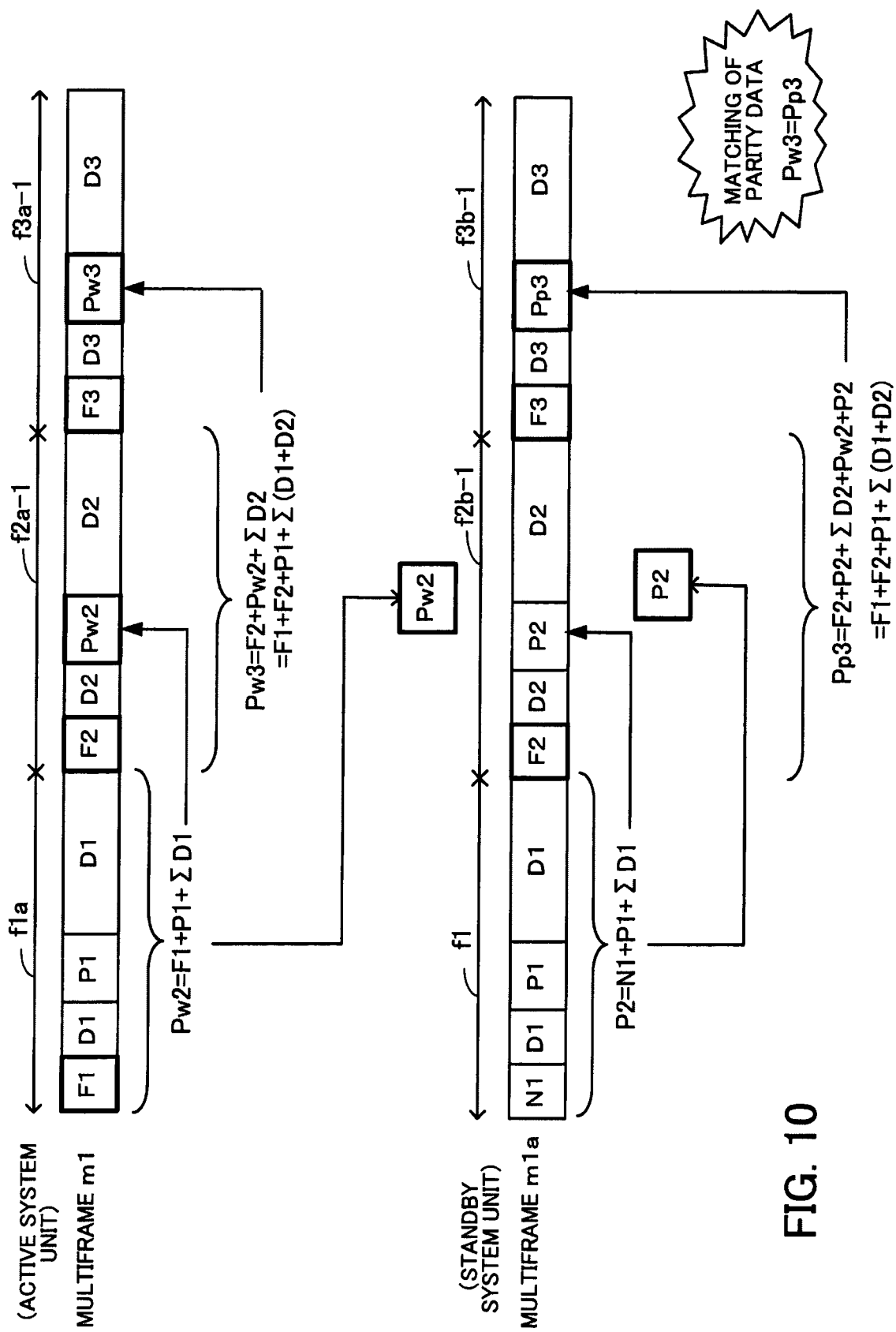
FIG. 10 illustrates a parity calculation.

The parity calculation will be described below. FIG. 10 illustrates the parity calculation. As illustrated in FIG. 2, the active system unit 10 is assumed to be different from the standby system unit 20 in the insertion start timing of the frame head code. One data value of the frame f1a of the active system unit 10 and the other data value of the frame f1 of the standby system unit 20 are assumed to be different from each other (a difference between the frame head code F1 and the unused overhead N1).

The parity calculation unit 11b of the active system unit 10 calculates the parity of the frame f1a as in the above-described formula (1), and acquires the parity data Pw2. Further, the parity data insertion unit 11c inserts the parity data Pw2 into the next frame, and generates the frame f2a-1.

In the same manner, the parity calculation unit 11b calculates the parity of the frame f2a-1 as in the above-described formula (2), and acquires the parity data Pw3. Further, the parity data insertion unit 11c inserts the parity data Pw3 into the next frame, and generates the frame f3a-1.

On the other hand, the parity calculation unit 21c of the standby system unit 20 calculates the parity of the frame f1 as in the above-described formula (3), and acquires the parity data P2. Further, the parity data insertion unit 21d inserts the parity data P2 into the next frame, and generates the frame f2b-1.

Next, the parity calculation unit 21c calculates the parity of the frame f2b-1. In this case, the parity calculation unit 21c further adds two parity data sets to the parity calculation result of the frame f2b-1, and performs a parity calculation.

Specifically, first parity data to be added is parity data, received by the parity data receiver 21b, calculated by the active system unit 10 and the parity data Pw2 as a parity calculation result of the frame f1a. In addition, second parity data is the parity data P2 as a parity calculation result of the frame f1.

Calculation contents will be specifically described. A parity calculation result Pp3 of the frame f2b-1 is calculated by using the following formula (5).

$$Pp3 = \left(F2 + P2 + \sum D2\right) + Pw2 + P2 \qquad (5)$$
$$= F2 + Pw2 + \sum D2$$
$$= F1 + F2 + P1 + \sum (D1 + D2)$$

In the parity calculation, since the same value is canceled each other, the parity data P2 is canceled out. Therefore, the transmission-side transmission apparatus 1a matches a value of the parity data Pw3 as a parity calculation result of the active system frame f2a-1 with that of the parity data Pp3 as a parity calculation result of the standby system frame f2b-1 of the standby system unit 20. Accordingly, when the above-described parity calculation is repeatedly performed, the transmission-side transmission apparatus 1a can match the active system parity data with the standby system parity data also with respect to subsequent frames.

As can be seen from the above sequence, the standby system unit 20 calculates the parity of the target frame f2b-1 including the parity data Pw2 of the active system frame f1a before one frame of the target frame f2b-1 and the parity data P2 (being the same value as that of the parity data P2 inserted into the target frame f2b-1) of the standby system frame f1 before one frame of the target frame f2b-1 with respect to the target frame f2b-1 of the parity calculation of the standby system unit 20.

As a result, the standby system unit 20 calculates the parity data P2 twice and canceled out it, and can acquire the same result as that of the parity calculation performed with respect to the frame f2a-1 in the active system unit 10, thereby completely matching the parity data of the standby system unit 20 with that of the active system unit 10.

In addition, when performing the above-described parity calculation, on the occasion when transmitting the parity data Pw2 of the frame f1a from the active system unit 10 to the standby system unit 20, the parity data Pw2 may be later than a position into which the parity data P2 of the frame f2b-1 is inserted. Accordingly, timing conditions can be relaxed.

Figure 11:
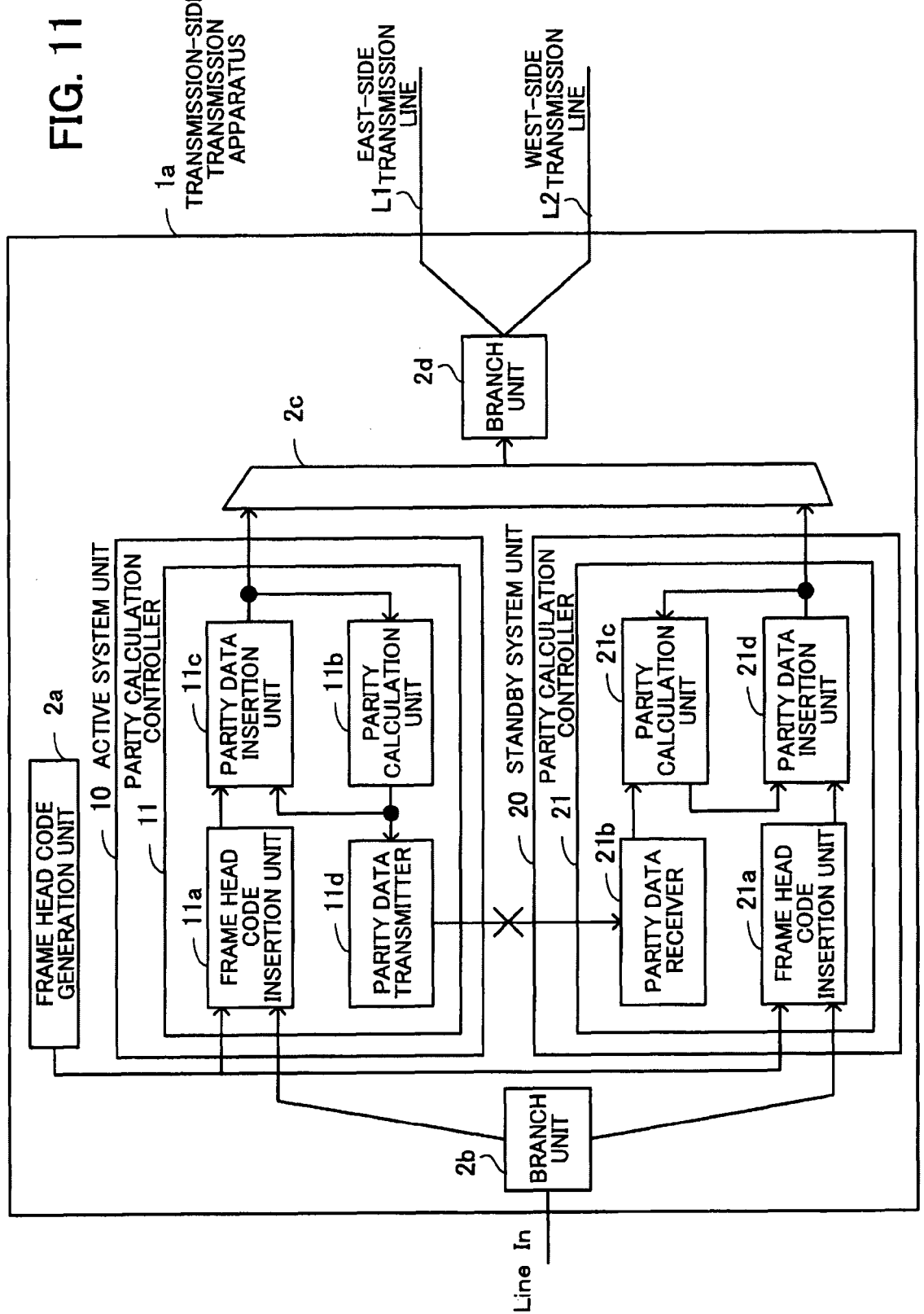
FIG. 11 illustrates a state at the time when a standby system unit is unable to receive parity data.

Operations at the time when the standby system unit 20 is unable to receive parity data transmitted from the active system unit 10 will be described below. FIG. 11 illustrates a state at the time when the standby system unit 20 is unable to receive the parity data. Suppose that when the transmission apparatus operates the system performing the above-described parity matching control, the parity data receiver 21b is unable to receive parity data transmitted from the parity data transmitter 11d (due to, for example, a trouble of the parity data transmitter 11d, and a disconnection of a line interconnecting the parity data transmitter 11d and the parity data receiver 21b).

Figure 12:
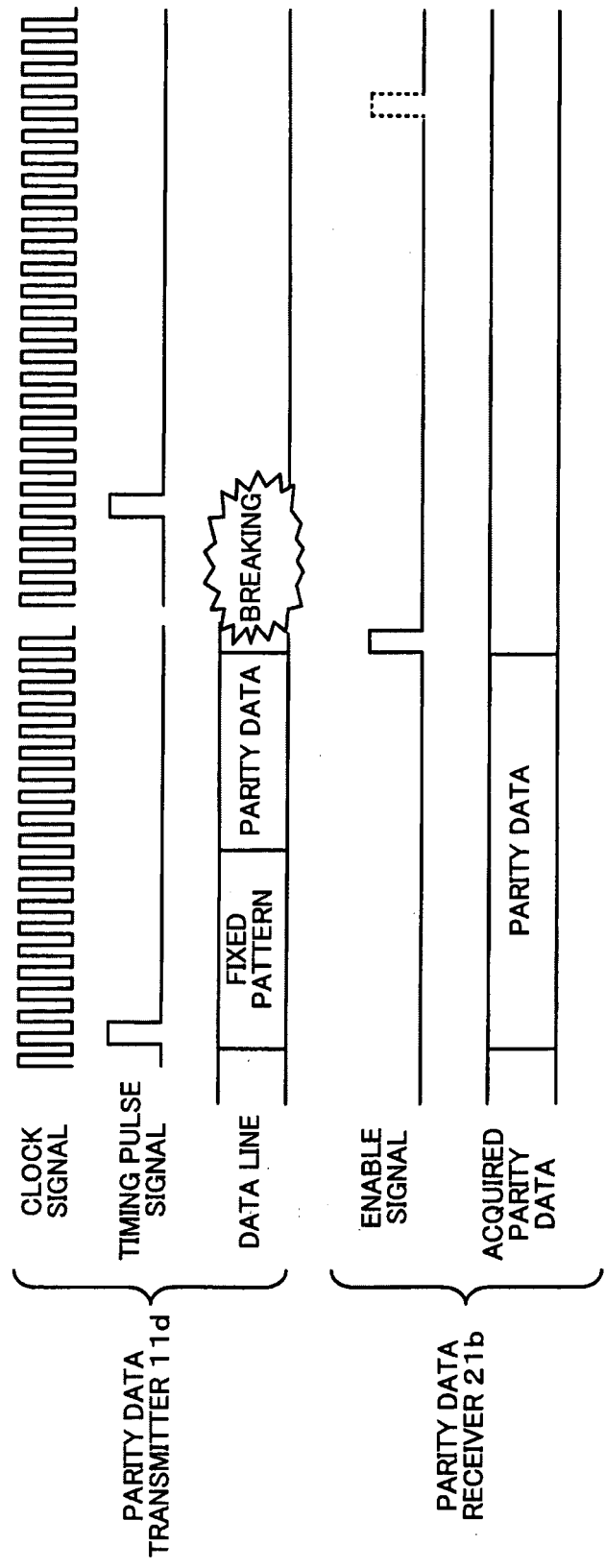
FIG. 12 illustrates timing of a signal related to a transmission and reception operation of the parity data.

FIG. 12 illustrates timing of signals related to transmission and reception operations of the parity data. A transmission line interconnecting the parity data transmitter 11d and the parity data receiver 21b includes a clock signal line, a timing pulse signal line, and a data line.

Through the clock signal line, a clock signal flows. Through the timing pulse signal line, a timing pulse signal indicating that the parity data transmitter 11d transmits valid parity data flows. Further, through the data line, parity data and fixed pattern to be transmitted flow. On the occasion when transmitting the parity data, the fixed pattern is added to the parity data. This fixed pattern is a pattern arbitrarily including values of "0" and "1".

The parity data receiver 21b receives the above-described clock signal, timing pulse signal, fixed pattern, and parity data. When receiving the timing pulse signal, the parity data receiver 21b recognizes that the parity data is transmitted from the parity data transmitter 11d, and generates an enable signal after the acquisition of the parity data.

Since a parity data value may be all "0" or all "1", the parity data receiver 21b cannot determine at the time of the above-described data value whether to transmit the parity data (cannot determine, for example, whether the parity data value is all "0" due to breaking, or the parity data value itself is all "0").

To cope with the above-described problem, the parity data transmitter 11d transmits the parity data along with the predetermined fixed pattern including values of "0" and "1". Then, when unable to detect the fixed pattern, the parity data receiver 21b determines to be unable to receive the parity data.

As can be seen from the above sequence, when the parity data transmitter 11d transmits the parity data having added thereto the fixed pattern including values of "0" and "1" from the active system unit 10 to the standby system unit 20, the parity data receiver 21b can determine whether to normally receive the parity data.

Figure 13:
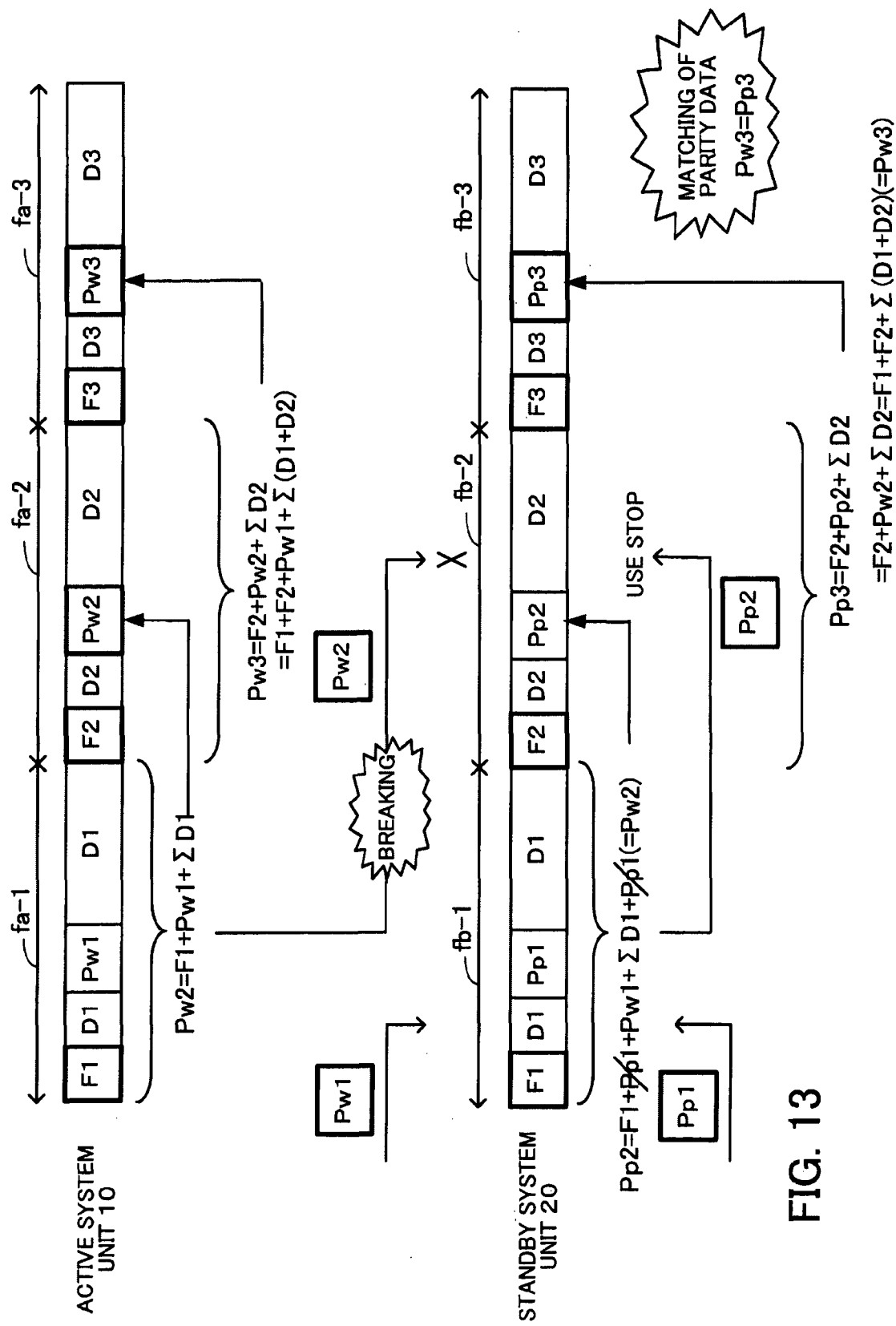
FIG. 13 illustrates the parity calculation.

FIG. 13 illustrates the parity calculation. Suppose that the parity data receiver 21b is unable to receive the parity data Pw2 of the frame fa-1. At this time, the parity calculation unit 21c of the standby system unit 20 calculates the parity of the frame fb-2 without including the parity data Pw2 as a parity calculation result of the frame fa-1 and the parity data Pp2 as a parity calculation result of the previous frame fb-1 of the target frame fb-2.

The parity calculation of the frame fb-2 is calculated by using the following formula (6). Further, the parity data insertion unit 21d inserts the parity data Pp3 as a calculation result into the next frame, and generates a frame fb-3.

$$Pp3 = F2 + Pp2 + \sum D2 \quad (6)$$
$$= F2 + \left(F1 + Pw1 + \sum D1\right) + \sum D2$$
$$= F1 + F2 + Pw1 + \sum (D1 + D2)$$

It is known from the fact that the transmission apparatus matches the parity data Pw3 of the active system frame fa-2 with the parity data Pp3 of the standby system frame fb-2. As can be seen from the above sequence, the transmission apparatus performs the parity matching control illustrated in FIG. 10 once and matches the active system parity data with the standby system parity data even in one frame. Then, when unable to receive the active system parity data, the transmission apparatus stops using the parity data before one frame of the target frame of the standby system unit, and calculates the parity of the target frame. As a result, even when unable to receive desired parity data from the active system unit, the transmission apparatus can match the active system parity data with the standby system parity data between corresponding frames.

According to the present embodiment, the proposed transmission apparatus can realize an improvement in transmission quality.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that various changes, substitutions and alterations could be made hereto without departing from the spirit and scope of the invention.

What is claimed is:

1. A transmission apparatus comprising:
 a first parity calculation controller to calculate parity in units of frame and insert a calculation result into a next frame with respect to a first frame sequence; and
 a second parity calculation controller to calculate parity in units of frame and insert a calculation result into a next frame with respect to a second frame sequence,
 wherein the second parity calculation controller receives from the first parity calculation controller first parity data which is a calculation result in which the parity is calculated by the first parity calculation controller, and which has a same value as that of a parity calculation result to be inserted into a target frame for parity calculation in the second frame sequence, and
 calculates the parity of the target frame including the first parity data and second parity data which is a result in which the parity of a previous frame positioned one frame before the target frame in the second frame sequence is calculated and matches one parity data in the first frame sequence with another parity data in the second frame sequence.

2. The transmission apparatus according to claim 1, wherein the second parity calculation controller calculates, when unable to receive the first parity data, the parity of the target frame without including the first parity data and the second parity data.

3. The transmission apparatus according to claim 1, wherein the first parity calculation controller transmits the first parity data to the second parity calculation controller along with a fixed pattern including values of "0" and "1".

4. A parity calculation method comprising:
 calculating parity in units of frame in a first parity calculation system, and inserting a calculation result into a next frame with respect to a first frame sequence; and
 calculating the parity in units of frame in a second parity calculation system, and inserting a calculation result into a next frame with respect to a second frame sequence,
 wherein the second parity calculation system calculates the parity of a target frame of the second frame sequence including first parity data and second parity data, in which the first parity data is a calculation result in which the parity is calculated by the first parity calculation system and which has a same value as that of a parity calculation result to be inserted into the target frame for parity calculation in the second frame sequence, and the second parity data is a result in which the parity of a previous frame positioned one frame before the target frame in the second frame sequence is calculated and matches one parity data in the first frame sequence with another parity data in the second frame sequence.

5. The parity calculation method according to claim 4, wherein when the first parity data is unable to be acquired during parity calculation of the target frame, the parity of the target frame is calculated without including the first parity data and the second parity data.

6. The parity calculation method according to claim 4, wherein the first parity calculation system transmits the first parity data to the second parity calculation system along with a fixed pattern including values of "0" and "1".

7. A transmission apparatus comprising:
 a frame head code generation unit to generate a frame head code;
 an active system unit including a first parity calculation controller to calculate parity in units of frame with respect to an active system frame sequence in which the frame head code is inserted into a predetermined position, and insert a calculation result into a next frame based on an insertion start timing of its own unit;
 a standby system unit including a second parity calculation controller to calculate the parity in units of frame with respect to a standby system frame sequence in which the frame head code is inserted into a predetermined position, and insert a calculation result into a next frame based on an insertion start timing of its own unit; and
 a selector to perform a switching output between an active system frame generated by the active system unit and a standby system frame generated by the standby system unit,
 wherein the second parity calculation controller receives from the first parity calculation controller first parity data which is a calculation result in which the parity is calculated by the first parity calculation controller and which has a same value as that of a parity calculation result to be inserted into a target frame for parity calculation in the standby system frame sequence, and
 calculates the parity of the target frame including the first parity data and second parity data which is a result in which the parity of a previous frame positioned one frame before the target frame in the standby system frame sequence is calculated and matches one parity data in the active system frame sequence with another parity data in the standby system frame sequence.

8. The transmission apparatus according to claim 7, wherein the second parity calculation controller calculates, when unable to receive the first parity data, the parity of the target frame without including the first parity data and the second parity data.

9. The transmission apparatus according to claim 7, wherein the first parity calculation controller transmits the first parity data to the second parity calculation controller along with a fixed pattern including values of "0" and "1".

* * * * *

UNITED STATES PATENT AND TRADEMARK OFFICE
CERTIFICATE OF CORRECTION

PATENT NO.        : 8,543,897 B2
APPLICATION NO.   : 13/064552
DATED             : September 24, 2013
INVENTOR(S)       : Akio Shinohara Page 1 of 1

It is certified that error appears in the above-identified patent and that said Letters Patent is hereby corrected as shown below:

Title Page, In Col. 2, Item (56), (Foreign Patent Documents), Line 2, Delete "11-150526" and insert
-- 11-150528 --, therefor.
Title Page, In Col. 2, Item (56), (Other Publications), Line 3, Delete "Japaneee" and insert
-- Japanese --, therefor.

Signed and Sealed this
Twenty-fourth Day of December, 2013

Margaret A. Focarino
*Commissioner for Patents of the United States Patent and Trademark Office*